United States Patent
Ma

(10) Patent No.: US 9,673,225 B2
(45) Date of Patent: Jun. 6, 2017

(54) ARRAY SUBSTRATE, FABRICATION METHOD THEREOF AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventor: Yu Ma, Beijing (CN)

(73) Assignees: BOE Technology Group Co., Ltd., Beijing (CN); Beijing BOE Display Technology Co., Ltd., Beijing (CN)

( * ) Notice: Subject to any disclaimer, the term of this patent is extended or adjusted under 35 U.S.C. 154(b) by 27 days.

(21) Appl. No.: 14/103,796

(22) Filed: Dec. 11, 2013

(65) Prior Publication Data

US 2014/0159204 A1 Jun. 12, 2014

(30) Foreign Application Priority Data

Dec. 11, 2012 (CN) .......................... 2012 1 0534066

(51) Int. Cl.
 *H01L 27/12* (2006.01)
 *G02F 1/1345* (2006.01)
 *G09G 3/20* (2006.01)

(52) U.S. Cl.
 CPC ........ *H01L 27/124* (2013.01); *G02F 1/13452* (2013.01); *G09G 3/20* (2013.01);
 (Continued)

(58) Field of Classification Search
 CPC ............. G09G 2320/0223; G09G 3/20; G09G 2300/0426; G09G 2300/043; G02F 1/13452; G02F 1/1345
 (Continued)

(56) References Cited

U.S. PATENT DOCUMENTS 7,459,780 B2    12/2008 Chen
8,089,598 B2 *   1/2012 Kim et al. ............... 349/149

FOREIGN PATENT DOCUMENTS

CN    101206364 A    6/2008
CN    102314003 A    1/2012
CN    102315211 A    1/2012

OTHER PUBLICATIONS

First Office Action for corresponding Chinese Patent Application No. 201210534066.X, 23 pages (including English translation), (Oct. 28, 2014).

* cited by examiner

*Primary Examiner* — Stephen Sherman
(74) *Attorney, Agent, or Firm* — Blakely, Sokoloff, Taylor & Zafman LLP

(57) ABSTRACT

Embodiments of the present invention provide an array substrate, a fabrication method thereof and a display device. The array substrate comprises a driver IC and pixel units, wherein each port of the driver IC is connected to a plurality of pixel units through a connecting structure, each connecting structure comprises a connecting line connected between a port of the driver IC and a plurality of pixel units, at least some of the connecting structures also comprise resistance regulating units for changing the total resistance values of the connecting structures, and the resistance regulating units are connected in series with the respective connecting lines; and/or the resistance regulating units are connected in parallel with parts of the respective connecting lines, so that the differences among resistance values of connecting structures can be reduced, and in turn the display effect of a display panel is improved.

6 Claims, 8 Drawing Sheets

(52) U.S. Cl.
CPC ............... *G09G 2300/0426* (2013.01); *G09G 2320/0223* (2013.01)

(58) Field of Classification Search
USPC .......................................... 345/100; 349/152
See application file for complete search history.

ARRAY SUBSTRATE, FABRICATION METHOD THEREOF AND DISPLAY DEVICE

FIELD OF THE INVENTION

The present invention relates to the field of display driving, and particularly relates to an array substrate, a fabrication method thereof and a display device.

BACKGROUND OF THE INVENTION

As optoelectronic display technology is becoming mature, users have raised increasingly higher requirements on the quality of display devices.

Inside a display device (such as liquid crystal display device, organic light emitting diode display device or the like), signals required in a display panel are provided by a driver IC (Integrated Circuit, which can be made in the form of a chip), and the signals provided by the driver IC are transmitted to respective pixel units in a display area via connecting lines distributed inside the display panel, for example, respective ports of a scanning driver IC are connected to a plurality of pixel units in the same line through connecting lines (scan lines), and respective ports of a data driver IC are connected to a plurality of pixel units in the same row through connecting lines (data lines).

However, during research and development, the inventor discovers at least the following disadvantages in the prior art: as different connecting lines are connected to different locations of the display area (i.e., pixel units in different lines or different rows), and distances between different connecting locations are usually larger than distances between respective ports of a driver IC, thus the lengths of the connecting lines are different (mainly referring to that the lengths of the parts of the connecting lines between the driver IC and the display area are different). The connecting lines are usually made of the same material and have equal sectional areas, and thus resistance values of different connecting lines are significantly different, and signal attenuation conditions of pixel units connected to different ports of the driver IC are inconsistent, which ultimately results in that the display effect of the display panel is not ideal.

SUMMARY OF THE INVENTION

The technical problem to be solved by the embodiments of the present invention is to provide an array substrate, a fabrication method thereof and a display device, which can reduce the differences among resistance values of connecting structures connected to respective ports of a driver IC, and further improve the display effect of a display panel.

To solve the above technical problem, the embodiments of the present invention adopt the following technical solutions:

The present invention provides an array substrate, comprising a driver IC and pixel units, wherein each port of the driver IC is connected to a plurality of pixel units through one connecting structure, each connecting structure comprises a connecting line connected between a port of the driver IC and a plurality of pixel units, and at least some of the connecting structures also comprise resistance regulating units for changing total resistance values of the connecting structures, and the resistance regulating units are connected in series with the respective connecting lines;
and/or
the resistance regulating units are connected in parallel with parts of the respective connecting lines.

Further, among the connecting structures connected to ports of the same kind of driver IC (a scanning/data driver IC), difference between a resistance value of the connecting structure with the largest resistance and a resistance value of the connecting structure with the smallest resistance, is smaller than or equal to 0.1%.

Further, resistance values of all connecting structures connected to the ports of the same kind of driver IC (a scanning/data driver IC) are the same.

Further, the resistance regulating units are resistance lines, a material of the resistance lines has a resistivity different from that of a material of the connecting lines, and resistance values of the resistance lines and the connecting lines with the same length are different.

Further, the connecting lines and the resistance lines are located in different layers, an insulating layer is provided between the connecting lines and the resistance lines, and the connecting lines and the resistance lines are connected with each other through vias in the insulating layer.

Preferably, the connecting lines and the resistance lines are located in two adjacent layers or the same layer, and the connecting lines and the resistance lines are connected with each other by way of an interfacial physical contact.

Preferably, the connecting lines are made of a metal material; and the resistance lines are made of a material of pixel electrodes in the pixel units.

In another aspect, the present invention also provides a display panel, comprising the above array substrate.

In still another aspect, the present invention also provides a fabrication method of an array substrate, comprising the step of forming patterns including connecting lines and resistance lines through patterning processes, wherein each of the connecting lines is used for connecting a port of a driver IC to a plurality of pixel units, a material of the resistance lines has a resistivity different from that of a material of the connecting lines, and resistance values of the resistance lines and the connecting lines with the same length are different, and the resistance lines are connected in series with the respective connecting lines;
and/or
the resistance lines are connected in parallel with parts of the respective connecting lines.

Further, the connecting lines include scan lines for connecting a scanning driver IC to pixel units, and the method comprises the following steps:

forming a pattern including scan lines through a patterning process; and forming a pattern including resistance lines through a patterning process, so that the scan lines and the resistance lines are connected with each other by way of an interfacial physical contact.

Further, the connecting lines include scan lines for connecting a scanning driver IC to pixel units, and the method comprises the following steps:

forming a pattern including scan lines through a patterning process;

forming an insulating layer and forming vias in the insulating layer through a patterning process; and forming a pattern including resistance lines through a patterning process, so that the scan lines and the resistance lines are connected with each other through the vias.

Further, the connecting lines include data lines for connecting a data driver IC to pixel units, and the method comprises the following steps:

forming a pattern including data lines through a patterning process; and forming a pattern including resistance lines through a patterning process, so that the data lines and the resistance lines are connected with each other by way of an interfacial physical contact.

Further, the connecting lines include data lines for connecting a data driver IC to pixel units, and the method comprises the following steps:

forming a pattern including data lines through a patterning process;

forming an insulating layer and forming vias in the insulating layer through a patterning process; and forming a pattern including resistance lines, so that the data lines and the resistance lines are connected with each other through the vias.

In the array substrate, the fabrication method thereof and the display device in the embodiments of the present invention, each connecting structure connecting the driver IC to the pixel units also comprises a resistance regulating unit (such as a resistance line) in addition to a connecting line. The resistance regulating unit can change the resistance value of the respective connecting structure, so that the differences among resistance values of the connecting structures become smaller, and in turn the display effect of the display panel is improved.

BRIEF DESCRIPTION OF THE DRAWINGS

To more clearly describe the technical solutions of embodiments of the present invention or the prior art, the drawings required to be used in the description of the embodiments will be simply introduced below. Obviously, the drawings described below are only for illustrating some embodiments of the present invention, and other drawings may be obtained according to these drawings by the person skilled in the art without creative efforts.

DETAILED DESCRIPTION OF THE EMBODIMENTS

An array substrate, a fabrication method thereof and a display device of the embodiments of the present invention can reduce the differences among resistance values of connecting lines and improve the display effect of a display panel.

In the description below, for illustration rather than limitation, concrete details are provided, such as specific system structures, interfaces, techniques and the like, to facilitate thorough understanding of the present invention. However, it should be clear to the person skilled in the art that the present invention may also be implemented in other embodiments without such concrete details. In other cases, detailed description of well known devices, circuits and methods are omitted, to avoid that unnecessary details hinder the description of the present invention.

The embodiments of the present invention are described below in detail in conjunction with the drawings below.

Figure 1:
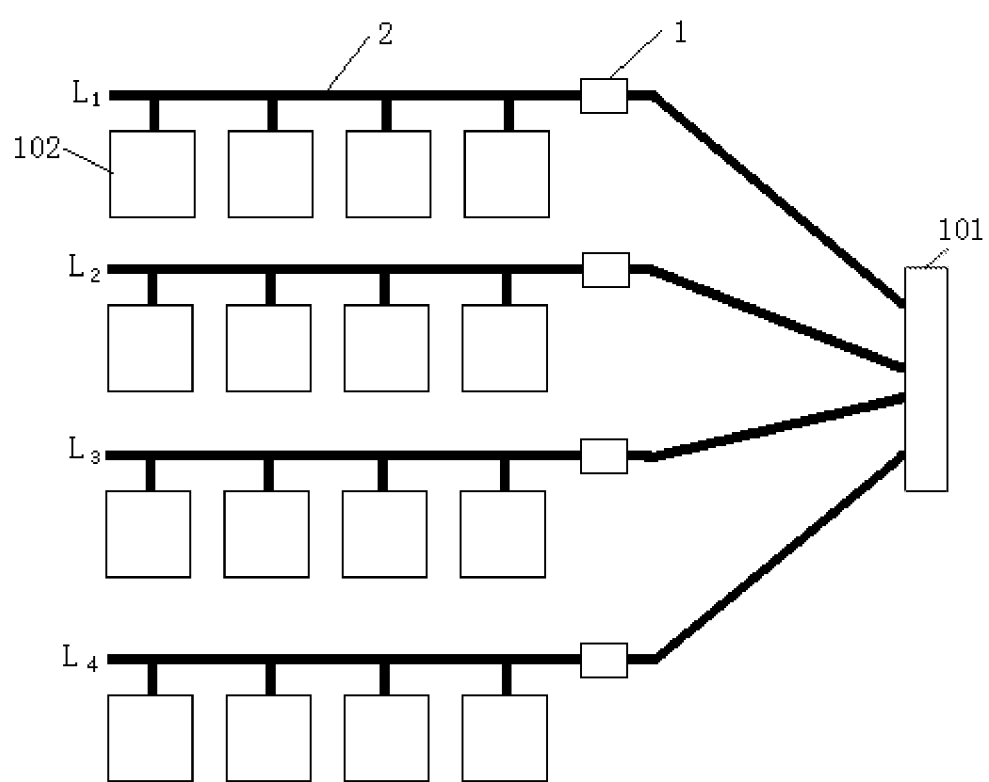
FIG. 1 is a first schematic diagram illustrating connection of connecting lines in an embodiment of the present invention.
Figure 2:
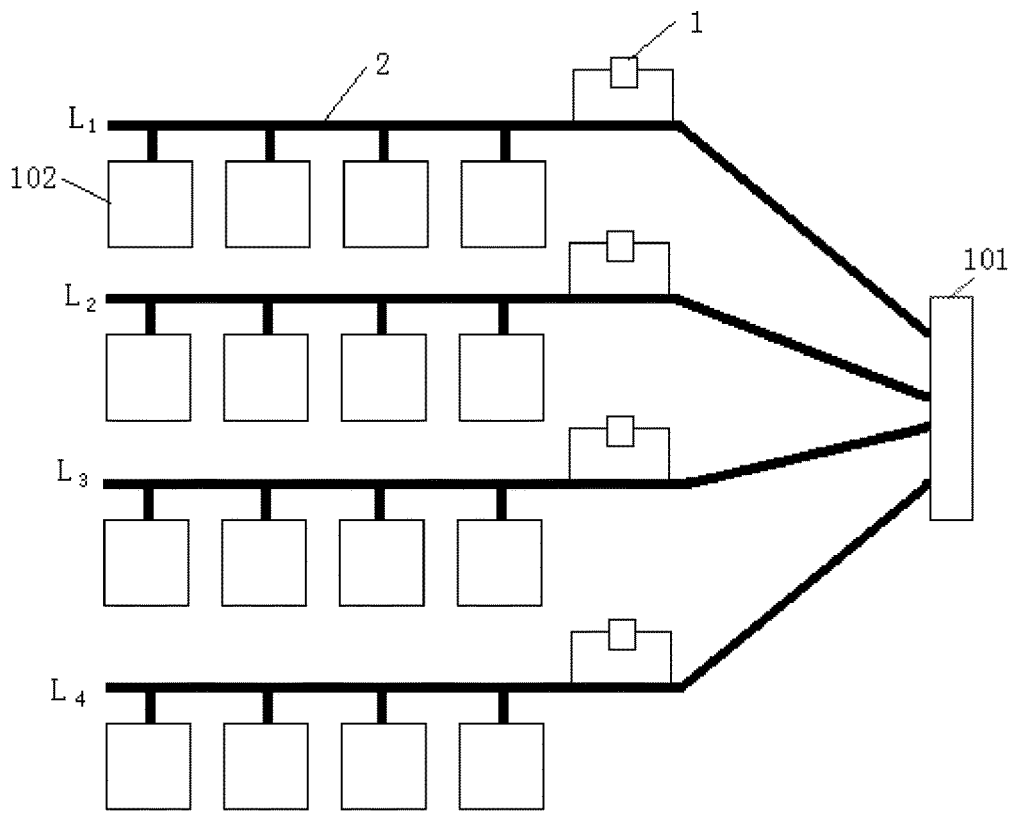
FIG. 2 is a second schematic diagram illustrating connection of connecting lines in an embodiment of the present invention.

An array substrate in an embodiment, as shown in FIG. 1 or 2, comprises a driver IC 101 and a plurality of pixel units 102, each port of the driver IC 101 is connected to a plurality of pixel units 102 through a connecting structure, each connecting structure comprises a connecting line 2 connected between the driver IC 101 and pixel units 102, and at least some of the connecting structures also comprise resistance regulating units 1; each resistance regulating unit 1 may be, as shown in FIG. 1, connected in series with the connecting line 2, or as shown in FIG. 2, connected in parallel with part of the connecting line 2. It should be understood that the resistance regulating unit 1 is not limited to the forms in FIGS. 1 and 2, for example, some of the connecting structures may not have a resistance regulating unit 1, or the same connecting structure may have a plurality of resistance regulating units 1, or among resistance regulating units 1 of different connecting structures, some may be connected in series and the others may be connected in parallel, or among resistance regulating units 1 of the same connecting structure, some may be connected in series and the others may be connected in parallel.

Each connecting structure in this embodiment comprises a connecting line 2 and a resistance regulating unit 1, and therefore there are many possibilities existing in the designing of connecting structure patterns. It should be noted that as shown in FIG. 1 or 2, only two possible connecting ways of the resistance regulating units 1 and the connecting lines 2 are shown as examples, and interlayer positions of the resistance regulating units 1 and the connecting lines 2 in the array substrate are determined by the fabrication process of the array substrate, that is, the resistance regulating units 1 and the connecting lines 2 may be located on two adjacent layers or on the same layer structure, and the resistance regulating units 1 and the connecting lines 2 may also be located on different layer structures (i.e., there may be other layer structures therebetween).

As a specific implement of the present invention, connecting structures $L_1$, $L_2$, $L_3$ and $L_4$ connecting a driver IC

101 to pixel units 102 are shown in FIG. 1, each connecting structure comprises a connecting line 2 and a resistance regulating unit 1, and the resistance regulating unit 1 is connected in series with the connecting line 2. Suppose that the total resistance value of the connecting structure is R, the resistance value of the connecting line is R', and the resistance value of the resistance regulating units is R". Calculating according to a resistance value calculation formula of a series circuit results in R=R'+R". The resistance values of the connecting structures $L_1$, $L_2$, $L_3$ and $L_4$ are $R_1=R_1'+R_1"$, $R_2=R_2'+R_2"$, $R_3=R_2'+R_4"$, and $R_4=R_4'+R_4"$, respectively. Therefore, the purpose of regulating the total resistance value of each connecting structure can be achieved by regulating the resistance value of the resistance regulating unit in each connecting structure.

As another specific implement of the present invention, connecting structures $L_1$, $L_2$, $L_3$ and $L_4$ connecting a driver IC 101 to pixel units 102 are shown in FIG. 2, each connecting structure comprises a connecting line 2 and a resistance regulating unit 1, and the resistance regulating unit 1 is connected in parallel with part of the connecting line 2. Suppose that the total resistance value of the connecting structure is R, the resistance value of the parallel portion of the connecting line 2 is R', the resistance value of the resistance regulating unit is R", the resistance value of the non-parallel portion of the connecting line 2 is R''', and the resistance value of the parallel portion of the connecting structure is R''''. Then according to a resistance value calculation formula of a parallel circuit: $1/R''''=1/R'+1/R"$, the resistance values of the parallel portions of the connecting structures $L_1$, $L_2$, $L_3$ and $L_4$ are calculated to be $1/R_1''''=1/R_1'+1/R_1"$, $1/R_2''''=1/R_2'+1/R_2"$, $1/R_3''''=1/R_3'+1/R_3"$, and $1/R_4''''=1/R_4'+1/R_4"$, respectively; thus, the total resistance values of the connecting structures $L_1$, $L_2$, $L_3$ and $L_4$ are $R_1=R_1''''+R_1'''$, $R_2=R_2''''+R_2'''$, $R_3=R_3''''+R3'''$, and $R_4=R_4''''+R_4'''$, respectively. Likewise, the purpose of regulating the total resistance value of each connecting structure can be achieved by regulating the resistance value of the resistance regulating unit in each connecting structure.

It should be noted that in a resistance calculation formula R=ρL/S, ρ is the resistivity of a material, S is the sectional area, and L is the length of a material. As to the connecting lines, in a case that both material used and sectional area are definite, the resistance values thereof are mainly affected by the lengths of the connecting lines. As to the connecting lines in the prior art, because they are connected to different locations in a display area (i.e., connected to pixel units in different lines or rows), this inevitably results in that the lengths of respective connecting lines are different, and even the resistance value of the longest connecting line portion may be 3-5 times that of the shortest connecting line portion between the driver IC and the display area. Each connecting structure in the above embodiment comprises a connecting line and a resistance regulating unit, the resistance regulating unit is connected in series with the connecting line or connected in parallel with part of the connecting line, and the total resistance value of the connecting structure may be changed by changing the resistance values of the resistance regulating unit and the connecting line, so that the differences among resistance values of respective connecting structures become smaller, and further, signal attenuation conditions on respective connecting structures are closer to each other, and thus improving the display effect of the display panel.

Preferably, among connecting structures connected to ports of the same kind of driver IC, the difference between the resistance value of the connecting structure with the largest resistance and the resistance value of the connecting structure with the smallest resistance is smaller than or equal to 0.1%. For example, among all connecting structures connected to ports of a scanning driver IC, if the resistance value of the connecting structure with the smallest resistance is 1000Ω, the resistance value of the connecting structure with the largest resistance should not exceed 1001Ω. In this case, the differences among resistance values of respective connecting structures are very small, and when signals are transmitted, the signal attenuation conditions on respective connecting structures become very similar to each other accordingly.

As the most preferred embodiment of the present invention, the total resistance values of the connecting structures connected to the ports of the same kind of driver IC are the same. When the connecting structures with the same resistance value are used to transmit signals, the signal attenuation conditions on the connecting structures become consistent, so that the display effect of the display panel can be greatly improved in this case.

Obviously, the comparison of resistance values of the connecting structures described above is directed to connecting structures connected to ports of the same kind of driver IC, that is, the connecting structures connected to ports of a scanning driver IC cannot be compared with the connecting structures connected to ports of a data driver IC.

Preferably, the above resistance regulating unit is a resistance line, the material of the resistance line has a resistivity different from that of the material of the connecting line, and the resistance values of the resistance line and the connecting line with the same length are different.

In an array substrate, it is difficult to arrange resistors due to limitation of a fabrication process, and preferably, the wiring form of lines (including paths and sectional areas of the lines) should not be optionally changed due to spatial limitation, and for this reason, a material with a resistivity different from that of the connecting line may be used to make the resistance line as the resistance regulating unit, so that different resistances of lines with the same length may be achieved without changing the routing form.

Of course, it should be understood that the resistance line should not be regarded as a limitation on the resistance regulating unit, that is, the resistance regulating unit may also be a resistor, or a line with a sectional area different from that of the connecting line (its material may be the same as or different from that of the connecting line), or a line configured to be bent (its material may be the same as or different from that of the connecting line).

Further preferably, the connecting line is made of a metal material, such as molybdenum, aluminum, niobium, or an alloy thereof. Whereas the resistance line is made of a material of a pixel electrode in the pixel unit; the material of the pixel electrode is usually a transparent conductive metal oxide, such as indium tin oxide (ITO), indium zinc oxide (IZO) or the like.

As a transparent conductive metal oxide usually has a resistivity larger than that of a metal material, it can be used as an alternative material of the resistance line; meanwhile, when the material of the pixel electrode is used to prepare the resistance line, the resistance line and the pixel electrode may be formed at the same time in one patterning process, so that no new process step needs to be added, and the preparation method is simple.

As one implement of the present invention, the connecting lines and the resistance lines are located in different layers, and an insulating layer (of course layers other than the insulating layer may also be included) is provided between the connecting lines and the resistance lines. In this case, vias need to be formed in the insulating layer, so that the connecting lines and the resistance lines are connected with each other through the vias.

As another implement of the present invention, when the connecting lines and the resistance lines are located in two adjacent layers, the connecting lines and the resistance lines may be connected with each other by way of an interfacial physical contact (i.e., direct contact). The embodiment of the present invention may be specifically as follows: firstly a connecting line film layer is formed, a resistance line film layer is directly formed on the connecting line film layer, and connecting lines partially covered with resistance lines are formed through one patterning process (such as a patterning process using a grayscale mask or a halftone mask). The embodiment of the present invention may also be as follows: firstly a resistance line film layer is formed, and a pattern including disconnected resistance lines is formed through one patterning process, then a connecting line film layer is formed, and connecting lines covering the resistance lines are formed through one patterning process.

As another implement of the present invention, when the connecting lines and the resistance lines are located in the same layer, the connecting lines and the resistance lines may be connected with each other by way of an interfacial physical contact (i.e., direct contact). The embodiment of the present invention may be specifically as follows: firstly a connecting line film layer is formed, and a pattern including disconnected connecting lines is formed through one patterning process, wherein the distance between two adjacent disconnected connecting lines is the length of the resistance line which need to be connected in series with the connecting lines. Then a resistance line film layer is directly formed on the connecting line pattern, and the resistance lines are formed through one patterning process, so that the resistance lines connect the disconnected portions of the connecting lines.

In addition, a display device in an embodiment of the present invention comprises an array substrate described above. In this display device, the structure and working principle of the array substrate are the same as those in the above embodiments, and are not elaborated herein. Furthermore, structures of other parts of the display device may refer to the prior art, and will not be described in detail herein.

The display device in the embodiment of the present invention may be any product or component with display function, such as a liquid crystal panel, an electronic paper, an OLED panel, a mobile phone, a tablet computer, a television, a display, a notebook computer, a digital photo frame, a navigator or the like.

In the display device of the embodiment of the present invention, a connecting structure connecting a driver IC and pixel units comprises a connecting line and a resistance line; the resistance line may be connected in series with the connecting line, or the resistance line may be connected in parallel with part of the connecting line, so that the differences among total resistance values of the connecting structures become smaller, and in turn the display effect of the display panel is improved.

In addition, the embodiments of the present invention provide a fabrication method of an array substrate, and this method comprises a step of forming patterns including connecting lines and resistance lines through patterning processes, wherein each of the connecting lines is used for connecting a port of a driver IC and a plurality of pixel units, the material of the resistance lines has a resistivity different from that of the material of the connecting lines, and the resistance values of the resistance lines and the connecting lines with the same length are different, and the resistance lines are connected in series with the respective connecting line;

and/or the resistance lines are connected in parallel with parts of the respective connecting lines.

It should be noted that the patterning process mentioned in the present invention refers to a photolithographic process including the steps of photoresist coating, exposure, development, etching, photoresist stripping, etc.

Figure 3:
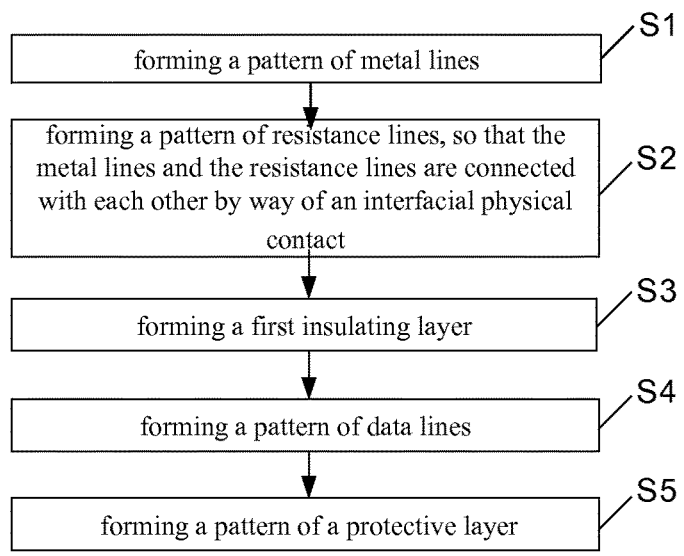
FIG. 3 is a first flow chart schematically illustrating a fabrication method of an array substrate in an embodiment of the present invention.

As a specific implement of the present invention, when the connecting lines are scan lines connecting a scanning driver IC and pixel units, as shown in FIG. 3, the method comprises the following steps:

S1, forming a pattern of connecting lines (scan lines).

Figure 4:
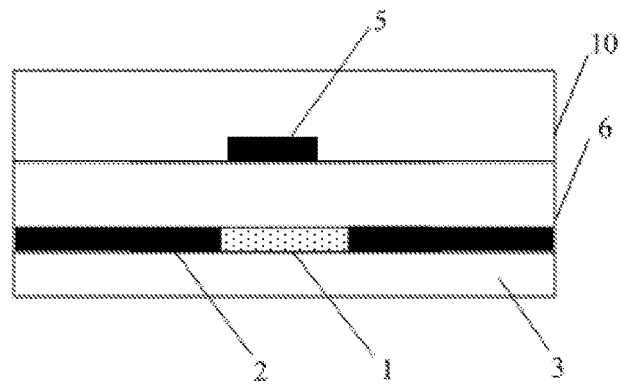
FIG. 4 is a first sectional structure diagram of an array substrate in an embodiment of the present invention.
Figure 5:
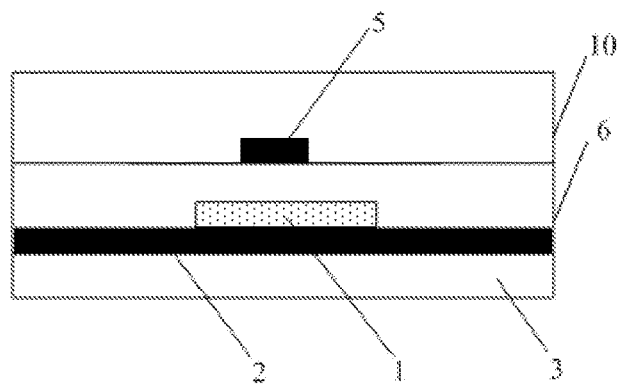
FIG. 5 is a second sectional structure diagram of an array substrate in an embodiment of the present invention.

Specifically, as shown in FIGS. 4 and 5, a layer of first metal layer is firstly formed on a substrate 3 through an evaporation or deposition process. Then, the pattern of connecting lines 2 is formed through a first patterning process.

S2, forming a pattern of resistance lines, and the connecting lines and the resistance lines are connected with each other by way of an interfacial physical contact.

Specifically, as shown in FIGS. 4 and 5, a first ITO layer is firstly formed on the substrate 3 subjected to step S1, and specifically, the first ITO layer may be formed through evaporation or deposition. Then, the pattern of resistance lines 1 is formed through a second patterning process.

S3, forming a first insulating layer.

Specifically, as shown in FIGS. 4 and 5, the first insulating layer 6 is formed on the substrate subjected to step S2 through evaporation or deposition.

S4, forming a pattern of data lines.

Specifically, as shown in FIGS. 4 and 5, a lyer of a second metal layer is firstly formed on the substrate subjected to step S3 through evaporation or depositiond. Then, the pattern of data lines 5 is formed through a third patterning process.

Further, after step S4 is completed, the method also comprises the following step:

S5, forming a protective layer 10.

Specifically, as shown in FIGS. 4 and 5, the protective layer 10 is formed on the substrate subjected to step S4 through evaporation or deposition, wherein the protective layer 10 is for the purpose of protecting interlayer structures.

It should be noted that in the fabrication method of this implement, there are two possibilities when the connecting lines formed in step S1 are connected to the resistance lines 1 formed in step S2: as shown in FIG. 4, the connecting line 2 has a disconnected portion, and the resistance line 1 is connected in the disconnected portion of the connecting line 2, that is, the resistance line 1 is connected in series with the connecting line 2 and in the same layer as the connecting line 2; or as shown in FIG. 5, the connecting line 2 is continuous, and the resistance line 1 covers part of the connecting line 2, that is, the resistance line 1 is connected in parallel with the part of the connecting line 2, and is located in a layer adjacent to the connecting line 2.

Figure 15:
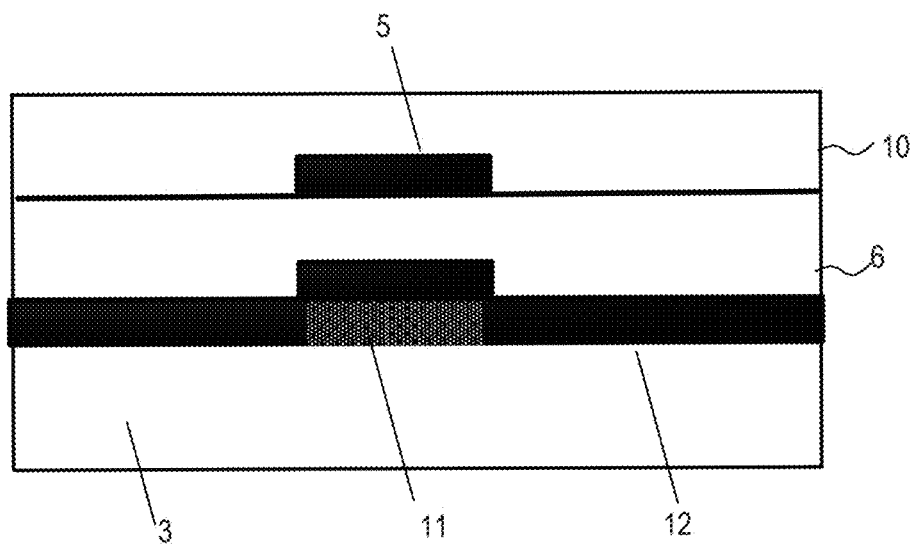
FIG. 15 is a view illustrating a ninth sectional structure diagram of an array substrate in an embodiment of the present invention.

FIG. 15 is a view illustrating a ninth sectional structure diagram of an array substrate in an embodiment of the present invention. As shown in FIG. 15, firstly a resistance line film layer is formed, and a pattern including disconnected resistance lines 11 is formed through one patterning process, then a connecting line film layer is formed, and connecting lines 12 covering the resistance lines 11 are formed through one patterning process.

The fabrication method of an array substrate in the embodiments of the invention can reduce the differences among resistance values of the connecting structures and in turn improve the display effect of the display panel.

Figure 6:
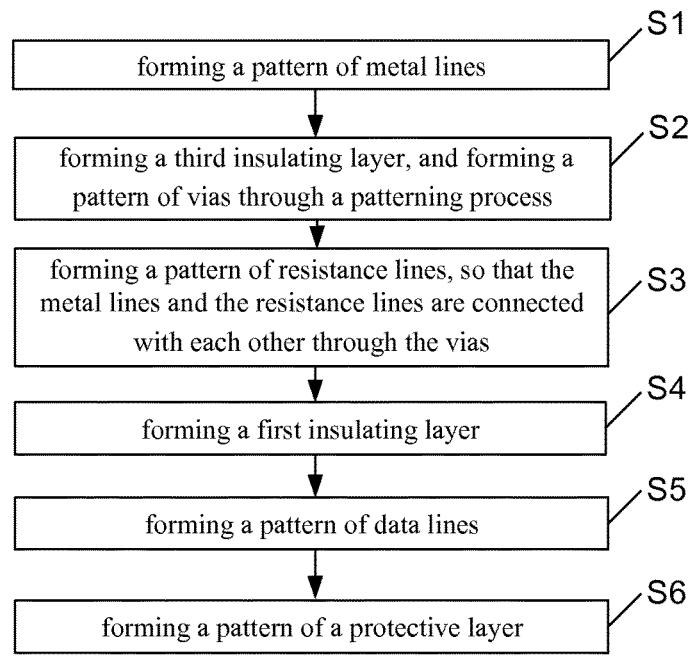
FIG. 6 is a second flow chart schematically illustrating a fabrication method of an array substrate in an embodiment of the present invention.

As another specific implement of the present invention, when the connecting lines are scan lines connecting a scanning driver IC and pixel units, as shown in FIG. 6, the method comprises the following steps:

S1, forming a pattern of connecting lines (scan lines).

Figure 7:
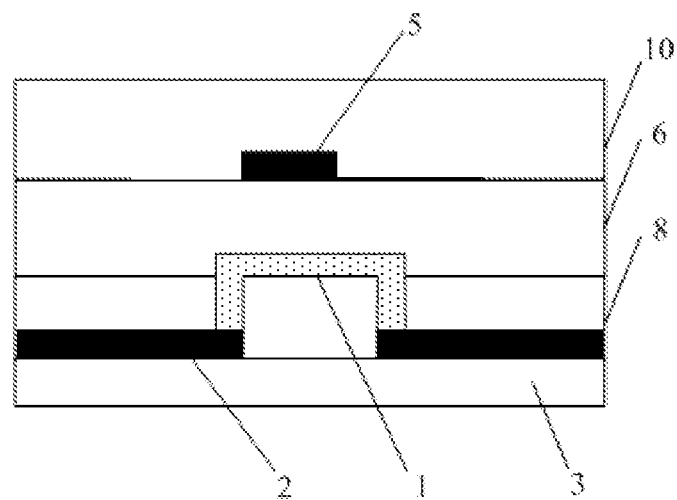
FIG. 7 is a third sectional structure diagram of an array substrate in an embodiment of the present invention.
Figure 8:
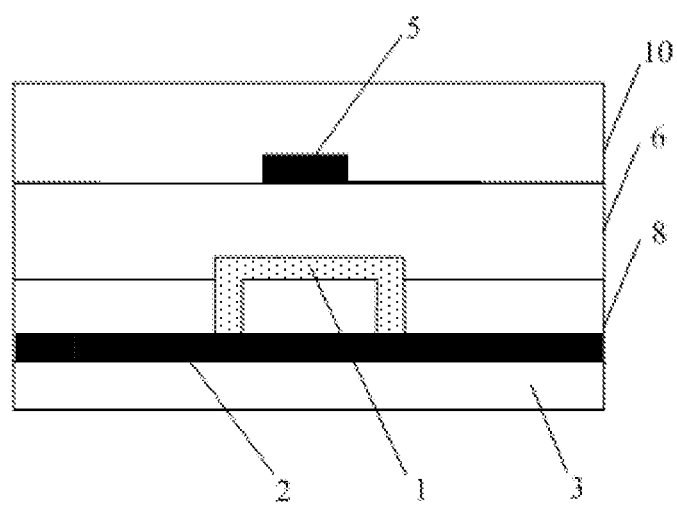
FIG. 8 is a fourth sectional structure diagram of an array substrate in an embodiment of the present invention.

Specifically, as shown in FIGS. 7 and 8, a layer of first metal layer is firstly formed on a substrate 3 through evaporation or deposition. Then, the pattern of connecting lines 2 is formed through a first patterning process.

S2, forming a third insulating layer, and forming a pattern of vias through a patterning process.

Specifically, as shown in FIGS. 7 and 8, a third insulating layer 8 is firstly forming on the substrate 3 subjected to step S1 through evaporation or deposition. Then, the pattern of vias is formed through a second patterning process.

S3, forming a pattern of resistance lines, so that the connecting lines and the resistance lines are connected with each other through the vias.

Specifically, as shown in FIGS. 7 and 8, a first ITO layer is firstly formed on the substrate 3 subjected to step S2 through evaporation or deposition. Then, the pattern of resistance lines 1 is formed through a third patterning process, and the resistance lines 1 and the connecting lines 2 are connected with each other through the vias formed in step S2.

S4, forming a first insulating layer.

Specifically, as shown in FIGS. 7 and 8, a first insulating layer 6 is formed on the substrate subjected to step S3 though evaporation or deposition.

S5, forming a pattern of data lines.

Specifically, as shown in FIGS. 7 and 8, a layer of second metal layer is firstly formed on the substrate subjected to step S4 through evaporation or deposition. Then, the pattern of data lines 5 is formed through a fourth patterning process.

Further, after step S5 is completed, the method also comprises the following step:

S6, forming a protective layer 10.

Specifically, as shown in FIGS. 7 and 8, the protective layer 10 is formed on the substrate subjected to step S5 through evaporation or deposition, wherein the protective layer 10 is for the purpose of protecting interlayer structures.

It should be noted that in the fabrication method of this implement, there are two possibilities when the connecting lines 2 formed in step S1 are connected to the resistance lines 1 formed in step S2: as shown in FIG. 7, in this case, the resistance line 1 is connected in series with the connecting line 2; and as shown in FIG. 8, in this case, the resistance line 1 is connected in parallel with part of the connecting line 2.

The fabrication method of the array substrate in the embodiments of the present invention can reduce the differences among resistance values of the connecting structures and in turn improve the display effect of the display panel.

Figure 9:
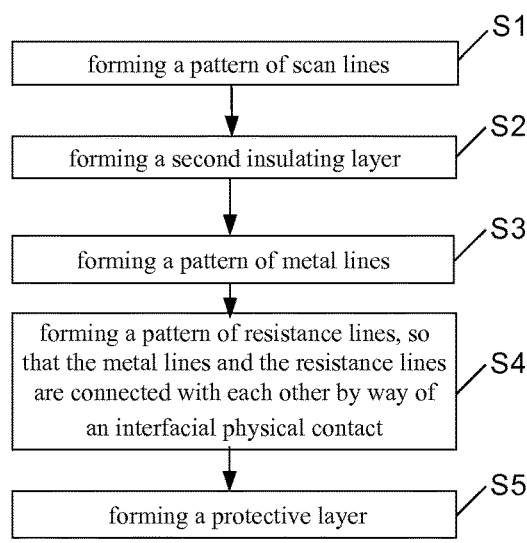
FIG. 9 is a third flow chart schematically illustrating a fabrication method of an array substrate in an embodiment of the present invention.

As another specific implement of the present invention, when the connecting lines are data lines connecting a data driver IC and pixel units, as shown in FIG. 9, the method comprises:

S1, forming a pattern of scan lines.

Figure 10:
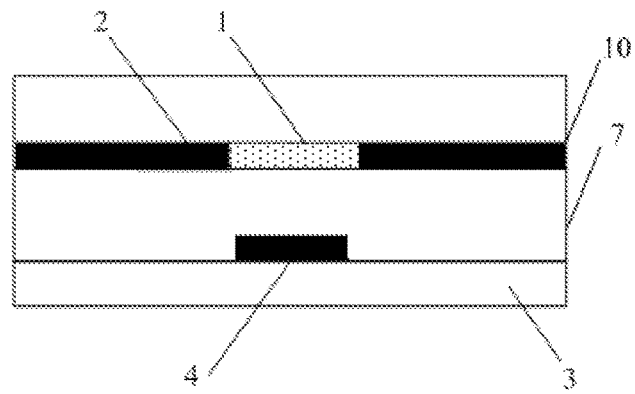
FIG. 10 is a fifth sectional structure diagram of an array substrate in an embodiment of the present invention.
Figure 11:
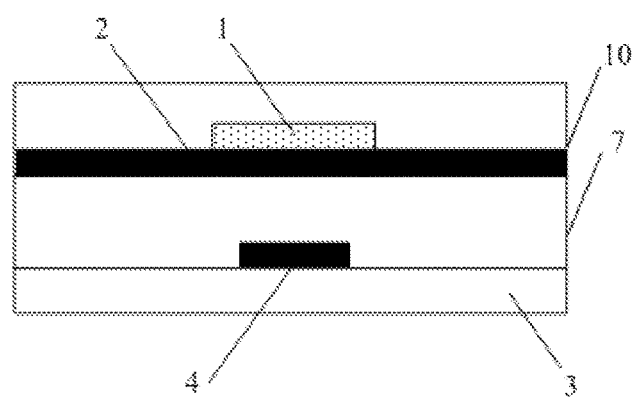
FIG. 11 is a sixth sectional structure diagram of an array substrate in an embodiment of the present invention.

Specifically, as shown in FIGS. 10 and 11, a layer of first metal layer is firstly formed on a substrate 3 through evaporation or deposition. Then, the pattern of scan lines 4 is formed through a first patterning process.

S2, forming a second insulating layer.

Specifically, as shown in FIGS. 10 and 11, a second insulating layer 7 is formed on the substrate 3 subjected to step S1 through evaporation or deposition.

S3, forming a pattern of connecting lines (data lines).

Specifically, as shown in FIGS. 10 and 11, a layer of second metal layer is formed on the substrate 3 subjected to step S2 through evaporation or deposition. Then, the pattern of connecting lines 2 is formed through a second patterning process.

S4, forming a pattern of resistance lines, and the connecting lines and the resistance lines are connected with each other by way of an interfacial physical contact.

Specifically, as shown in FIGS. 10 and 11, a first ITO layer is formed on the substrate 3 subjected to step S3 through evaporation or deposition. Then, the pattern of resistance lines 1 is formed through a third patterning process.

Further, after step S4 is completed, the method also comprises the following step:

S5, forming a protective layer.

Specifically, as shown in FIGS. 10 and 11, a protective layer 10 is formed on the substrate subjected to step S4 through evaporation or deposition, wherein the protective layer 10 is for the purpose of protecting interlayer structures.

It should be noted that in the fabrication method of this implement, there are two possibilities when the connecting lines 2 formed in step S1 are connected to the resistance lines 1 formed in step S2: as shown in FIG. 10, in this case, the resistance line 1 is connected in series with the connecting line 2; and as shown in FIG. 11, in this case, the resistance line 1 is connected in parallel with part of the connecting line 2.

The fabrication method of the array substrate in the embodiments of the present invention can reduce the differences among resistance values of the connecting structures and in turn improve the display effect of the display panel.

Figure 12:
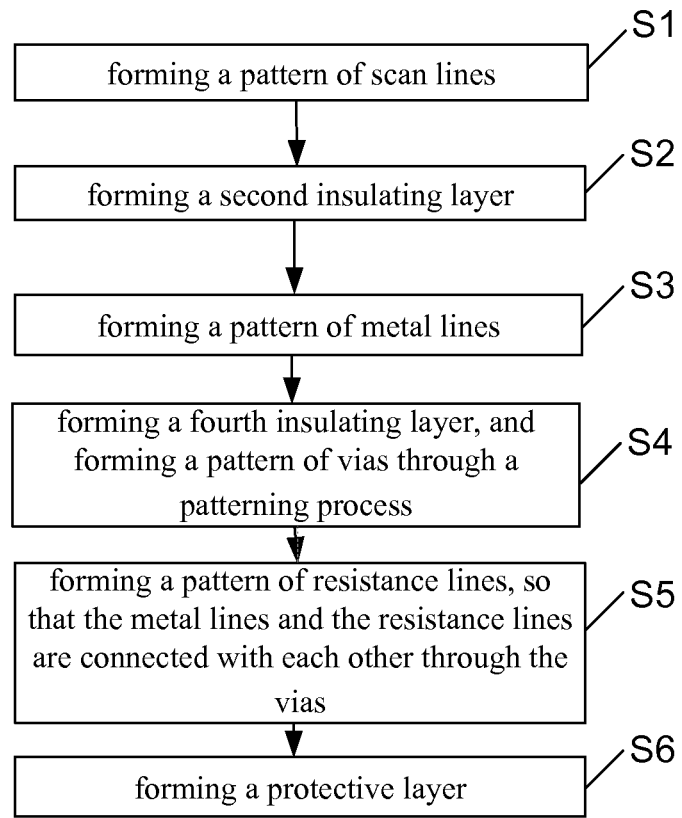
FIG. 12 is a fourth flow chart schematically illustrating a fabrication method of an array substrate in an embodiment of the present invention.

As another specific implement of the present invention, when the connecting lines are data lines connecting a data driver IC and pixel units, as shown in FIG. 12, the method comprises the following steps:

S1, forming a pattern of scan lines.

Figure 13:
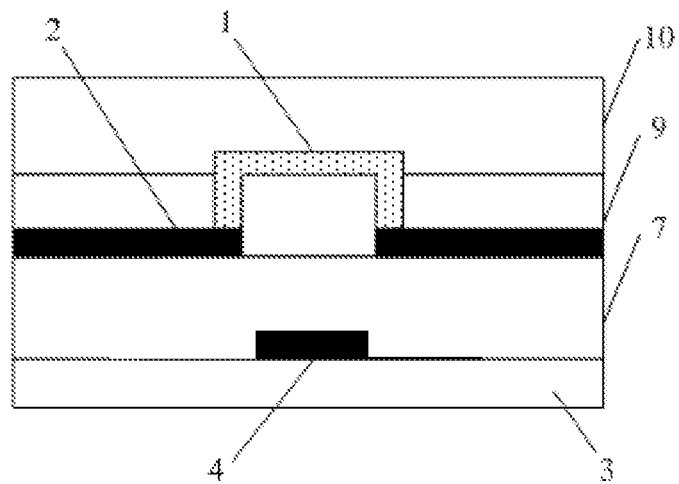
FIG. 13 is a seventh sectional structure diagram of an array substrate in an embodiment of the present invention.
Figure 14:
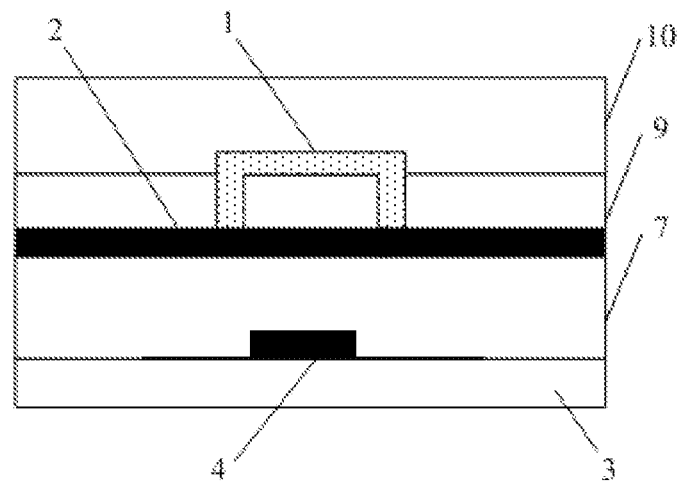
FIG. 14 is a eighth sectional structure diagram of an array substrate in an embodiment of the present invention.

Specifically, as shown in FIGS. 13 and 14, a layer of first metal layer is firstly formed on a substrate 3 through evaporation or deposition. Then, the pattern of scan lines 4 is formed through a first patterning process.

S2, forming a second insulating layer.

Specifically, as shown in FIGS. 13 and 14, a second insulating layer 7 is formed on the substrate 3 subjected to step S1 through evaporation or deposition.

S3, forming a pattern of connecting lines (scan lines).

Specifically, as shown in FIGS. 13 and 14, a layer of second metal layer is formed on the substrate 3 subjected to step S2 through evaporation or deposition. Then, the pattern of connecting lines 2 is formed through a second patterning process.

S4, forming a fourth insulating layer, and forming a pattern of vias through a patterning process.

Specifically, as shown in FIGS. 13 and 14, a fourth insulating layer 9 is formed on the substrate 3 subjected to step S3 through evaporation or deposition. Then, the pattern of vias is formed through a third patterning process.

S5, forming a pattern of resistance lines, so that the connecting lines and the resistance lines are connected with each other through the vias.

Specifically, as shown in FIGS. 13 and 14, a first ITO layer is formed on the substrate 3 subjected to step S4 through evaporation or deposition. Then, the pattern of resistance lines 1 is formed through a fourth patterning process, and the resistance lines 1 are connected to the connecting lines 2 through the vias formed in step S4.

Further, after step S5 is completed, the method also comprises the following step:

S6, forming a protective layer.

Specifically, as shown in FIGS. 13 and 14, a protective layer 10 is formed on the substrate subjected to step S5 through evaporation or deposition, wherein the protective layer 10 is for the purpose of protecting interlayer structures.

It should be noted that in the fabrication method of this implement, there are two possibilities when the connecting lines 2 formed in step S1 are connected to the resistance lines 1 formed in step S2: as shown in FIG. 13, in this case, the resistance line 1 is connected in series with the connecting line 2; and as shown in FIG. 14, in this case, the resistance line 1 is connected in parallel with part of the connecting line 2.

The fabrication method of the array substrate in the embodiments of the present invention can reduce the differences among resistance values of the connecting structures and in turn improve the display effect of the display panel.

Preferably, in the fabrication methods of the array substrate in the above embodiments, a pattern of pixel electrodes is also formed while forming the pattern including the resistance lines through a patterning process.

That is to say, the resistance lines yma be made of the material of the pixel electrodes, and formed in the same step as the pixel electrodes, so as to simplify the fabrication process of the array substrate.

It should be noted that in the embodiments of the present invention, the specific implement of each step, especially the description about the interlayer structure and the shape of the interlayer structure, is only exemplary description instead of limitation on the technical solution, and the person skilled in the art may set and choose according to actual need. As a preferred fabrication process, for example, the fabrication process of the connecting lines may be combined with the fabrication process of other metal interlayer structures, so as to reduce fabrication steps of the array substrate; as another example, the data lines are not necessarily formed after the scan lines, and may also be formed before the scan lines are formed; as still another example, the resistance lines are not necessarily formed after forming the connecting lines, and may also be formed before the connecting lines are formed. Furthermore, patterns of respective structural devices may vary with the design of a display, and are not limited herein. Meanwhile, it should be understood that FIGS. 4, 5, 7, 8, 10, 11, 13 and 14 only schematically show the layer relationship between the data lines and the scan lines, do not define specific dimensional relation between the data lines and the scan lines, and do not indicate that the scan lines and the data lines must overlap with each other at locations where the resistance lines are provided.

What described above is only specific implements of the present invention, but the protection scope of the present invention is not limited thereto. Variations or alternatives that are readily conceivable to the person skilled in the art within the technical scope of the disclosure of the present invention are intended to be encompassed by the protection scope of the present invention. Therefore, the protection scope of the present invention is only defined by the appended claims.

What is claimed is:

1. An array substrate comprising a driver IC and pixel units, each port of the driver IC being connected to a plurality of pixel units through a connecting structure, each connecting structure comprising a connecting line connected between a port of the driver IC and a plurality of pixel units, and at least some of the connecting structures also comprise resistance regulating units for changing total resistance values of the connecting structures, wherein, one end of the connecting line is directly connected to a port of the driver IC and the other end of the connecting line is connected to one of the plurality of pixel units, and wherein the resistance regulating units are connected in parallel with parts of the respective connecting lines, wherein the resistance regulating units are resistance lines, the connecting lines and the resistance lines are located in two directly adjacent layers, and the connecting lines and the resistance lines are connected with each other by way of an interfacial physical contact, and wherein the resistance lines are arranged under the connecting lines and made of a material of pixel electrodes in the pixel units, and the resistance lines and the pixel electrodes are arranged in a same layer.

2. The array substrate according to claim 1, wherein among the connecting structures connected to ports of the same kind of driver IC, difference between a resistance value of the connecting structure with the largest resistance and a resistance value of the connecting structure with the smallest resistance is smaller than or equal to 0.1%.

3. The array substrate according to claim 2, wherein resistance values of all connecting structures connected to the ports of the same kind of driver IC are the same.

4. The array substrate according to claim 1, wherein a material of the resistance lines has a resistivity different from that of a material of the connecting lines, and resistance values of the resistance lines and the connecting lines with the same length are different.

5. The array substrate according to claim 4, wherein, the connecting lines are made of a metal material.

6. A display device, comprising an array substrate comprising a driver IC and pixel units, each port of the driver IC being connected to a plurality of pixel units through a connecting structure, each connecting structure comprising a connecting line connected between a port of the driver IC and a plurality of pixel units, and at least some of the connecting structures also comprise resistance regulating units for changing total resistance values of the connecting structures, wherein, one end of the connecting line is directly connected to a port of the driver IC and the other end of the connecting line is connected to one of the plurality of pixel units, and wherein the resistance regulating units are connected in parallel with parts of the respective connecting lines, wherein the resistance regulating units are resistance lines, the connecting lines and the resistance lines are located in two directly adjacent layers, and the connecting lines and the resistance lines are connected with each other by way of an interfacial physical contact, and wherein the resistance lines are arranged under the connecting lines and made of a material of pixel electrodes in the pixel units, and the resistance lines and the pixel electrodes are arranged in a same layer.

* * * * *